United States Patent
Jeon et al.

(10) Patent No.: US 9,985,022 B2
(45) Date of Patent: May 29, 2018

(54) ELECTRONIC DEVICE INCLUDING A CASCODE CIRCUIT HAVING PRINCIPAL DRIVE AND BYPASS TRANSISTORS

(71) Applicant: SEMICONDUCTOR COMPONENTS INDUSTRIES, LLC, Phoenix, AZ (US)

(72) Inventors: Woochul Jeon, Phoenix, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/286,042

(22) Filed: Oct. 5, 2016

(65) Prior Publication Data
US 2018/0096993 A1     Apr. 5, 2018

(51) Int. Cl.
*H01L 29/41*     (2006.01)
*H01L 27/088*    (2006.01)
*H01L 29/778*    (2006.01)

(52) U.S. Cl.
CPC ........ *H01L 27/0883* (2013.01); *H01L 29/778* (2013.01)

(58) Field of Classification Search
CPC ................. H01L 21/823456; H01L 29/42376
See application file for complete search history.

(56) References Cited

U.S. PATENT DOCUMENTS

| | | | |
|---|---|---|---|
| 2008/0061291 A1* | 3/2008 | Dusa .................. | G03F 7/70633 257/48 |
| 2009/0201072 A1 | 8/2009 | Honea et al. | |
| 2012/0235209 A1 | 9/2012 | Briere et al. | |
| 2014/0070320 A1* | 3/2014 | Mukherjee ...... | H01L 21/823456 257/368 |
| 2015/0311339 A1* | 10/2015 | Toyoda ............... | H01L 29/7835 257/334 |
| 2016/0351564 A1* | 12/2016 | Azize ................ | H01L 29/66704 |

* cited by examiner

*Primary Examiner* — Thomas L Dickey
(74) *Attorney, Agent, or Firm* — Abel Law Group, LLP

(57) ABSTRACT

An electronic device can include a first transistor including a first gate electrode; and a second transistor including a second gate electrode. The first and second transistors can be electrically connected in a parallel arrangement, wherein the transistors have one or more different characteristics. For example, gate length, barrier layer thickness, gate-to-drain distance, leakage current, on-state electron density, or the like may be different between the transistors. The difference in characteristics can help to reduce degradation and improve the lifetime of the first transistor.

17 Claims, 5 Drawing Sheets

ELECTRONIC DEVICE INCLUDING A CASCODE CIRCUIT HAVING PRINCIPAL DRIVE AND BYPASS TRANSISTORS

FIELD OF THE DISCLOSURE

The present disclosure relates to electronic devices, and more particularly to, electronic devices that include cascode circuits having principal drive and bypass transistors.

RELATED ART

A cascode circuit can include a high-side transistor and a low-side transistor, where the circuit is typically controlled by signals provided to the gate of the low-side transistor. The high-side transistor can include a GaN high electron mobility transistor (HEMT), and the low-side transistor can include a Si metal-insulator-semiconductor field-effect transistor (MISFET). As the circuit is designed to operate at a higher drive current, leakage current will likewise increase. At higher temperatures, the leakage current of the GaN HEMT is lower than the Si MISFET. Over time, the leakage current and dynamic on-state resistance of the GaN HEMT increases. Further improvement to reduce leakage current and extend the operating lifetime of the GaN HEMT in a cascode configuration is desired.

BRIEF DESCRIPTION OF THE DRAWINGS

Embodiments are illustrated by way of example and are not limited in the accompanying figures.

Figure 1:
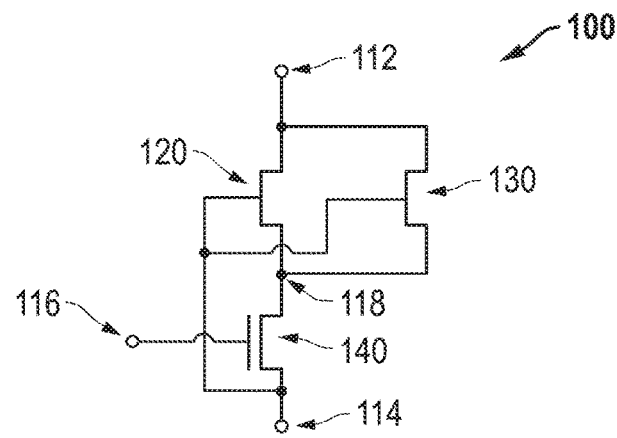
FIG. 1 includes a schematic diagram of a cascode circuit that includes a principal drive high-side transistor, a bypass transistor connected in parallel with the principal drive high-side transistor, and a low-side transistor.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_yGa_{(1-y)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

In the specification, channel length and gate length are measured in a direction between the source electrode and drain electrode of a transistor. Channel width of the transistor is measured in a direction perpendicular to the channel length.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a first transistor including a first gate electrode and a second transistor including a second gate electrode. The first and second transistors can be electrically connected in a parallel arrangement, wherein the transistors have one or more different characteristics. For example, the first gate electrode may have a longer gate length as compared to the second gate electrode, a barrier layer may be thinner under the second gate electrodes as compared to under the first gate electrode, the second transistor may have a gate-to-drain distance that is less as compared to the first transistor, the second transistor may have a higher leakage current as compared to the first transistor, or the like. In a particular embodiment, the first transistor can be a principal drive transistor, and the second transistor can be a bypass transistor.

The cascode circuit can include a principal drive high-side transistor, a bypass transistor, and a low-side transistor, wherein, the principal drive high-side and bypass transistors are configured in a parallel relationship. When in the off-state, the cascode circuit is configured such that more leakage current can flow through the bypass transistor than any particular principal drive high-side transistor. The lower leakage current flowing through such particular principal drive high-side transistor helps to reduce degradation of the principal drive high-side transistor and allows the dynamic on-state resistance ($R_{DSON}$) to increase more slowly over the operational lifetime of the principal drive high-side transistor and provide a longer operation lifetime of the principal drive high-side transistor. The circuits and benefits are better understood with the embodiments as described is more detail below. After reading this specification, skilled artisans will appreciate that the embodiments are exemplary and do not limit the scope of the appended claims.

FIG. 1 includes a circuit schematic of a cascode circuit 100 that includes a principal drive high-side transistor 120, a bypass transistor 130, and a low-side transistor 140. The significance of the bypass transistor 130 is described below in more detail. In an embodiment, the transistors 120 and 130 are depletion-mode transistors, and the low-side transistor 140 is an enhancement-mode transistor. In an alternative embodiment, the low-side transistor 140 is a depletion-mode transistor. In a particular embodiment, each of the transistors 120 and 130 is a depletion-mode HEMT, and the low-side transistor 140 is a Si MISFET. In another embodiment, the low-side transistor 140 is an enhancement-mode HEMT. In an embodiment, drains of the transistors 120 and 130 are coupled to a relatively high voltage power supply terminal 112, sources of the transistors 120 and 130 are coupled to a drain of the low-side transistor 140 at a mid-node 118, and a source of the low-side transistor 140 is coupled to a relatively low voltage power supply terminal 114 and the gates of the transistors 120 and 130. The gate of the low-side transistor 140 can be coupled to a cascode circuit control terminal 116, which can be connected to a cascode circuit control module (not illustrated) that can include a gate driver circuit.

In the cascode circuit 100, the bypass transistor 130 is designed to have more leakage current as compared to the principal drive high-side transistor 120 when the circuit 100 is in its off-state. Thus, the principal drive high-side transistor 120 will have less leakage current passing though it, as compared to a cascode circuit without the bypass transistor 130. Therefore, the principal drive high-side transistor 120 will have less degradation and have a longer lifetime. In a particular embodiment, the bypass transistor 130 can be designed to match better the leakage current of the low-side transistor 140.

When the cascode circuit 100 is in its on-state, significantly more current flows through the principal drive high-side transistor 120 as compared to the bypass transistor 130. Thus, the principal drive high-side transistor 120 carries most of the current between the relatively high voltage power supply terminal 112 and the mid-node 118.

The principal drive high-side transistor 120 in the cascode circuit 100 has a channel width that is significantly greater than the channel width of the bypass transistor 130. The channel width of the principal drive high-side transistor 120 is at least 11 times, at least 20 times or at least 50 times the channel width of the bypass transistor 130. In an embodiment, the channel width of the principal drive high-side transistor 120 is at most $1 \times 10^6$ times greater than the channel width of the bypass transistor 130. For any particular transistor structure, the channel width can be determined by calculating the area of the active region between the source and drain regions and dividing such area by the distance between the source and drain regions.

Figure 2:
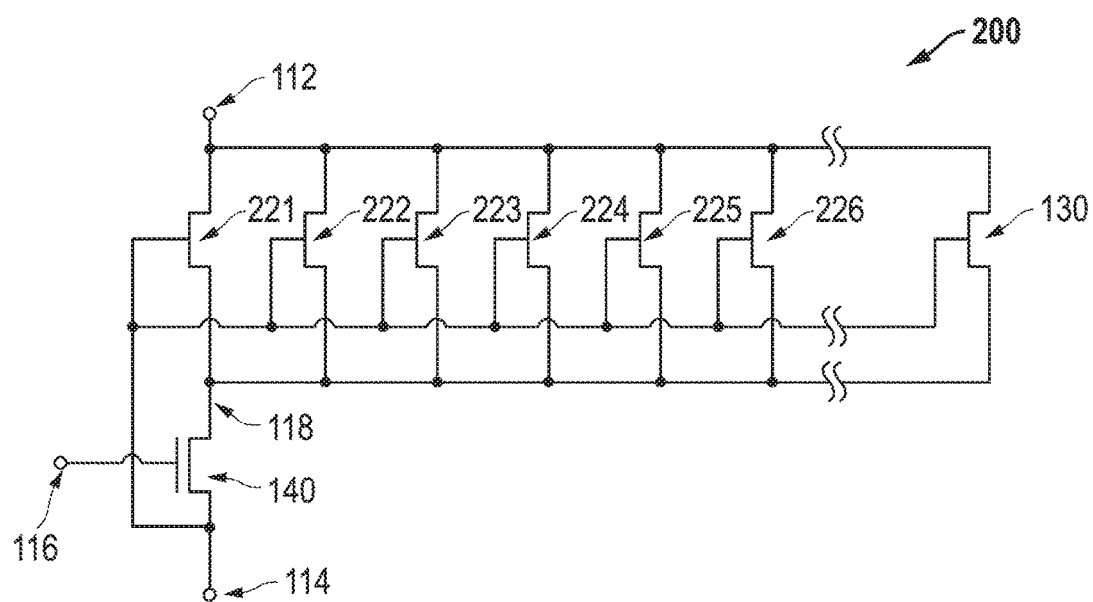
FIG. 2 includes a schematic diagram of a cascode circuit that includes principal drive high-side transistors, a bypass transistor connected in parallel with the principal drive high-side transistors, and a low-side transistor.

FIG. 2 includes a circuit schematic of a cascode circuit 200 that is similar to the cascode circuit 100, except that the principal drive high-side transistor 120 is replaced by a plurality of principal drive high-side transistors. FIG. 2 includes principal drive high-side transistors 221 to 226; however, more or fewer principal drive high-side transistors may be used. The drains of the principal drive high-side transistors and the bypass transistor 130 are coupled to one another, the gates of the principal drive high-side transistors and the bypass transistor 130 are coupled to one another, and the sources of the principal drive high-side transistors and the bypass transistor 130 are coupled to one another. For the cascode circuits 100 and 200, each of the bypass transistor 130 and the low-side transistor 140 may include one transistor or may include a set of transistor structures connected in a manner similar the principal drive high-side transistors 221 to 226 in FIG. 2.

The set of principal drive high-side transistors in the cascode circuit 200 has an effective channel that is that is significantly greater than the channel width of the bypass transistor 130. For the set of principal drive high-side transistors in the cascode circuit 200, the effective channel width is the sum of the channel widths of the individual principal drive high-side transistors within the set of principal drive high-side transistors. The effective channel width of the principal drive high-side transistor structures in cascode circuit 200 is at least 11 times, at least 30 times or at least 70 times the channel width of the bypass transistor 130. In an embodiment, the effective channel width of the set of principal drive high-side transistors is at most $1 \times 10^6$ times greater than the channel width of the bypass transistor 130. In a particular embodiment, the set of principal drive high-side transistors can include over 100 transistor structures for each transistor structure of the bypass transistor 130.

Figure 3:
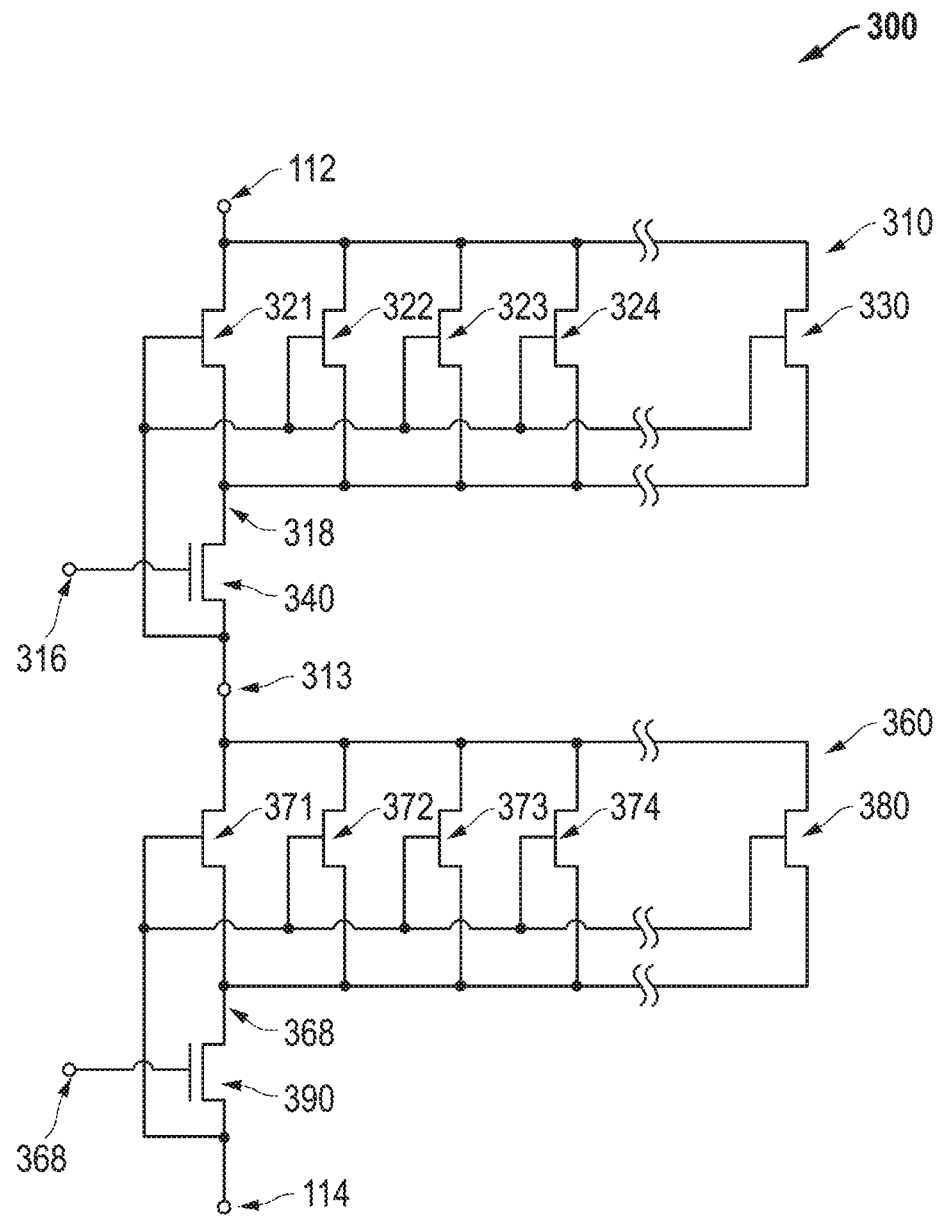
FIG. 3 includes a schematic diagram of a half bridge circuit that includes cascode circuits where each of the cascode circuits includes a cascode circuit similar to that illustrated in FIG. 2.

FIG. 3 includes a circuit schematic of a half bridge circuit 300 that includes an upper cascode circuit 310 and a lower cascode 360 that are coupled to each other at a switching node 313. Although not illustrated, a load, passive components, another suitable component, or any combination thereof may be coupled to the switching node 313. Such passive components can help to reduce ringing or other adverse effects at the switching node 313.

In the embodiment as illustrated, each of the cascode circuits 310 and 360 are similar to the cascode circuit 200. The cascode circuit 310 includes principal drive high-side transistors 321 to 324, a bypass transistor 330, and a low-side transistor 340. The low-side transistor 340 is coupled to the principal drive high-side transistors 321 to 324 and the bypass transistor 330 at mid-node 318. The cascode circuit 360 includes principal drive high-side transistors 371 to 374, a bypass transistor 380, and a low-side transistor 390. The low-side transistor 390 is coupled to the principal drive high-side transistors 371 to 374 and the bypass transistor 390 at mid-node 368. In another embodiment, more or fewer principal drive high-side transistors may be used for either or both of the cascode circuits 310 and 360. In a further embodiment, either or both of the cascode circuits 310 and 360 may have a design more similar to the cascode circuit 100.

For each of the cascode circuits 330 and 360 in the embodiment illustrated in FIG. 3, the drains of the principal drive high-side transistors and the bypass transistor are coupled to one another, the gates of the principal drive high-side transistors and the bypass transistor are coupled to one another, and the sources of the principal drive high-side transistors and the bypass transistor 130 are coupled to one another.

In particular embodiment, any one or more of the couplings in the circuits described with respect to FIGS. 1 to 3 may be in the form of electrical connections. For example, sources of the principal drive high side and bypass transistors can be electrically connected to the drain of the low-side transistor at the mid-node. In another example, the gates of the principal drive high side and bypass transistors can be electrically connected to the source of the low-side transistor.

Structural differences between the principal drive high-side and bypass transistors can allow the electronic properties to be achieved that allow for less degradation and longer lifetime of the principal drive high-side transistors. As will be described in more detail below, a relatively smaller gate length for the bypass transistor, a relatively thinner barrier layer may underlie the gate electrode of the bypass transistor, a smaller gate-to-drain distance for the bypass transistor as compared to the principal drive high-side transistor, or another difference between the bypass and principal drive high-side transistors can used.

Figure 4:
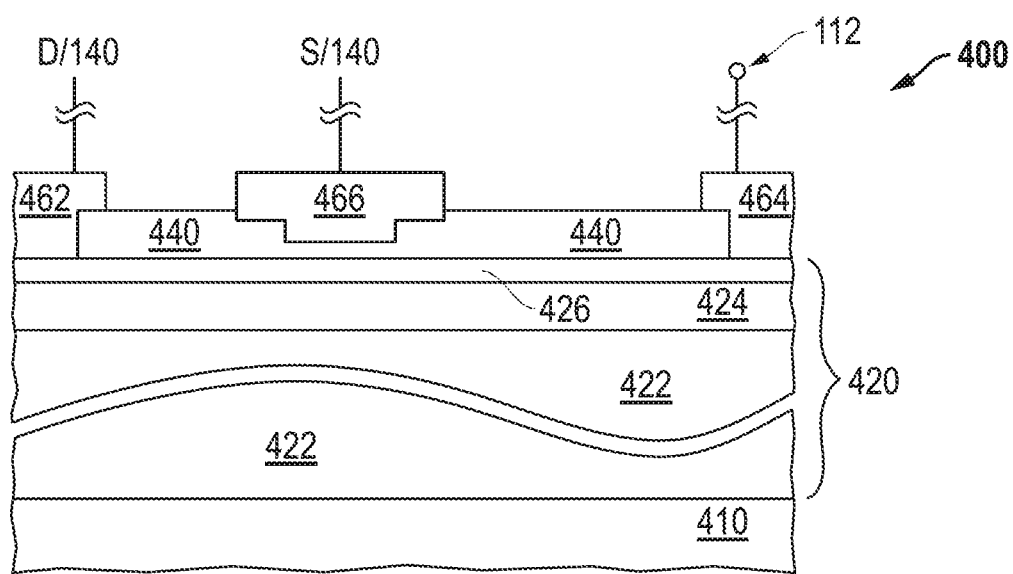
FIG. 4 includes a cross-sectional view of a principal drive high-side transistor of a cascode circuit.

FIG. 4 includes a cross-sectional view of a portion of a workpiece that includes a principal drive high-side transistor structure 400. The workpiece can include other principal drive high-side transistor structures that are substantially identical to the principal drive high-side transistor structure 400. The principal drive high-side transistor structure 400 can include a substrate 410, a semiconductor stack 420, and a dielectric layer 440. The substrate 410 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the semiconductor stack 420 that will be subsequently formed over the substrate 410.

The semiconductor stack 420 can include a buffer layer 422, a channel layer 424, and a barrier layer 426. Each of the layers within the semiconductor stack 420 can include a III-N semiconductor material, and in a particular embodiment include $Al_xGa_{(1-x)}N$, where $0 \leq x \leq 1$. The composition of the buffer layer 422 may depend on the composition of the channel layer 424. The composition of the buffer layer 422 can be changed as a function of thickness, such that the buffer layer 422 has a relatively greater aluminum content closer to the substrate 410 and relatively greater gallium content closer to the channel layer 424. In a particular embodiment, the cation (metal atoms) content in the buffer layer 422 near the substrate 410 can be 10% to 100% Al with the remainder Ga, and the cation content in the buffer layer 422 near the channel layer 424 can be 0% to 50% Al with the remainder Ga. The buffer layer 422 can have a thickness in a range of approximately 1 micron to 5 microns.

The channel layer 424 can include $Al_yGa_{(1-y)}N$, where $0 \leq x \leq 0.1$ and have a thickness in a range of approximately 20 nm to 4000 nm. In a particular embodiment, the channel layer 424 is a GaN layer that may be doped with an electron acceptor dopant. The barrier layer 426 can be used to help reduce the likelihood of migration of contaminants or other materials between one or more layers underlying the barrier layer 426 and the dielectric layer 440. In a particular embodiment, the barrier layer 426 can include $Al_yGa_{(1-y)}N$, wherein $0.05 \leq y \leq 0.3$. The barrier layer 426 can have a thickness in a range of approximately 2 to 30 nm. The semiconductor stack 420 is formed using an epitaxial growth technique, and thus the channel layer 424 and barrier layer 426, and at least a portion of the buffer layer 422 can be monocrystalline. In a particular embodiment, metal-containing films can be formed using metalorganic chemical vapor deposition. In another embodiment, different composition for the semiconductor stack 420 may be used, e.g., InAlGaN, InP, or the like.

The dielectric layer 440 can include a gate dielectric film, an intermediate film, and a capping film. The different films within the dielectric layer 440 are not illustrated to simplify understanding of concepts as described herein. In an embodiment, the gate dielectric film can be formed to protect the underlying layers present over the substrate 410. In an embodiment, the gate dielectric film can include a silicon nitride, an aluminum oxide, a zirconium oxide, a hafnium oxide, a niobium oxide, another suitable dielectric material, or any combination thereof and have a thickness in a range of 5 nm to 60 nm. The intermediate film can act as an etch-stop layer when etching the capping film. In an embodiment, the intermediate film can include AlN and have a thickness in a range of 2 nm to 20 nm. The capping film can protect the gate dielectric film. In an embodiment, the capping film can include silicon nitride and have a thickness in a range of 20 nm to 500 nm. In another embodiment, the dielectric layer 440 can include fewer or more films that may have the same or different compositions as described. When the intermediate film includes AlN, an optional $Al_2O_3$ film (not illustrated) can be formed by oxidizing a portion of the intermediate film in an oxidizing ambient, such as $O_2$, $N_2O$, or the like. The dielectric layer 440 or any films of the dielectric layer 440 can be formed using a chemical or physical vapor technique.

In an embodiment, the semiconductor stack 420, and at least one of the films of the dielectric layer 440 are formed without exposing the workpiece to air or another oxygen-containing gas. Thus, the layers and films can be formed little or no oxide at an interface between any of the layers and films. In another embodiment, the workpiece may be exposed to air between forming any one or more of the films or layers. If an interfacial oxide is not to remain in the finished device, the interfacial oxide may be reduced in a reducing ambient or etched, for example, back sputtering, to remove the interfacial oxide before forming the subsequent layer or film. In still another embodiment, an oxide film may be formed and remain. For example, after forming the gate dielectric film, the workpiece may be exposed to air before forming the capping film.

A source electrode 462, a drain electrode 464, and a gate electrode 466 are formed. In an embodiment, the dielectric layer 440 is patterned to define contact openings that expose the barrier layer 426. Some or all of the barrier layer 426 may also be removed. The source and drain electrodes 422 and 424 can be formed within the contact openings.

The capping film can be patterned to define an opening that extends through at least some of thickness of the dielectric layer 440 for the gate electrode 466. The intermediate film may or may not be patterned in defining the opening. The gate electrode 466 is formed within the opening. In another embodiment, the dielectric layer 440 may be patterned similar to the depletion-mode transistor.

Figure 5:
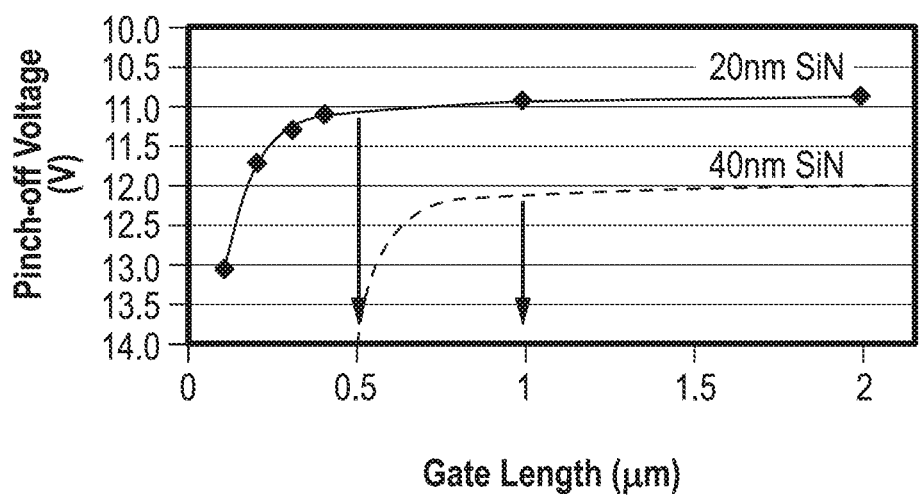
FIG. 5 includes a plot of pinch-off voltage versus gate length for different thicknesses of a silicon nitride film.

A conductive layer can be deposited and patterned to form the gate electrode 466. In an embodiment, the gate electrode 466 can have a gate length that is the same or greater than a critical gate length for the gate dielectric film. The critical gate is the gate length where, for a particular drain current (e.g., 1 microampere), a longer gate length does not significantly affect the pinch-off voltage and a shorter gate length significantly affects the pinch-off voltage. FIG. 5 includes a plot of a simulation of pinch-off voltage versus gate length in order to achieve 1 microampere of drain current. As can be seen in FIG. 5, the critical gate length is affected by the composition and thickness of the gate dielectric film. For a 20 nm thick silicon nitride film (e.g., $Si_3N_4$), the critical gate length is about 0.5 micron, and for a 40 nm thick silicon nitride film (e.g., $Si_3N_4$), the critical gate length is about 1.0 micron. An upper limit on the gate length may be determined by other factors, such as sufficient spacing between the gate and drain electrodes 466 and 464 to reduce gate-to drain capacitance, size of the transistor structure 400, switching speed of the transistor structure 400, or the like. In an embodiment, the gate length is a range of 1 micron to 10 microns.

In a further embodiment, the capping film may be patterned as previously described, and the intermediate film may be oxidized or an oxide film can be formed within the opening before forming the gate electrode 466. After reading this specification, skilled artisans will able to select the formation process for the gate electrode 466 to meet the needs or desires for a particular application.

Figure 6:
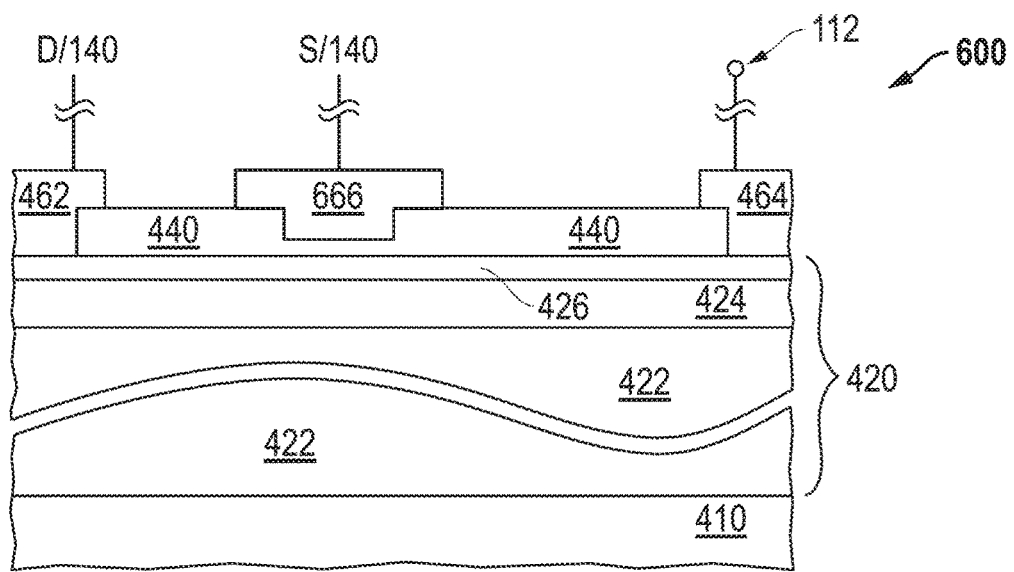
FIG. 6 includes a cross-sectional view of a bypass transistor of the cascode circuit where the cascode circuit includes the principal drive high-side transistor of FIG. 4.

FIG. 6 includes a cross-sectional view of another portion of the workpiece that includes a bypass transistor structure 600. The bypass transistor structure 600 can be substantially the same as the principal drive high-side transistor structure 400 except that the gate electrode 666 has a gate length less than the gate length of the gate electrode 466 of the principal high-side transistor structure 400. In an embodiment, the gate length of the gate electrode 666 is less than the critical gate length for the gate dielectric film. For a 20 nm thick silicon nitride film (e.g., $Si_3N_4$), the gate length is less than about 0.5 micron, and for a 40 nm thick silicon nitride film (e.g., $Si_3N_4$), the gate length is less than about 1.0 micron. A lower limit on the gate length may be determined by other factors, such as a resolution of a lithography tool, acceptable leakage current for the bypass transistor, or the like. In an embodiment, the gate length is a range of 10 nm to 1 micron.

The combination of the transistor structures 400 and 600 can allow the transistor structure 600 to have higher leakage current as compared to transistor structure 400 when the voltage on the gate electrodes 400 and 600 is the same. In a particular example, the gate dielectric film includes silicon nitride and has a thickness of 40 nm, and the gate lengths for the gate electrodes 466 and 666 can be 1.0 micron and 0.5 micron respectively. When the gate electrodes 466 and 666 are at −13.0 V, the transistor structure 400 has a drain current less than 1 microampere, and the transistor structure 600 has a drain current greater than 1 microampere. Thus, the principal drive transistor structure 400 has a lower leakage current as compared to the bypass transistor structure 600. Therefore, the bypass transistor structure 600 can help allow the principal drive transistor structure 400 to have less degradation and a longer operational lifetime.

Figure 7:
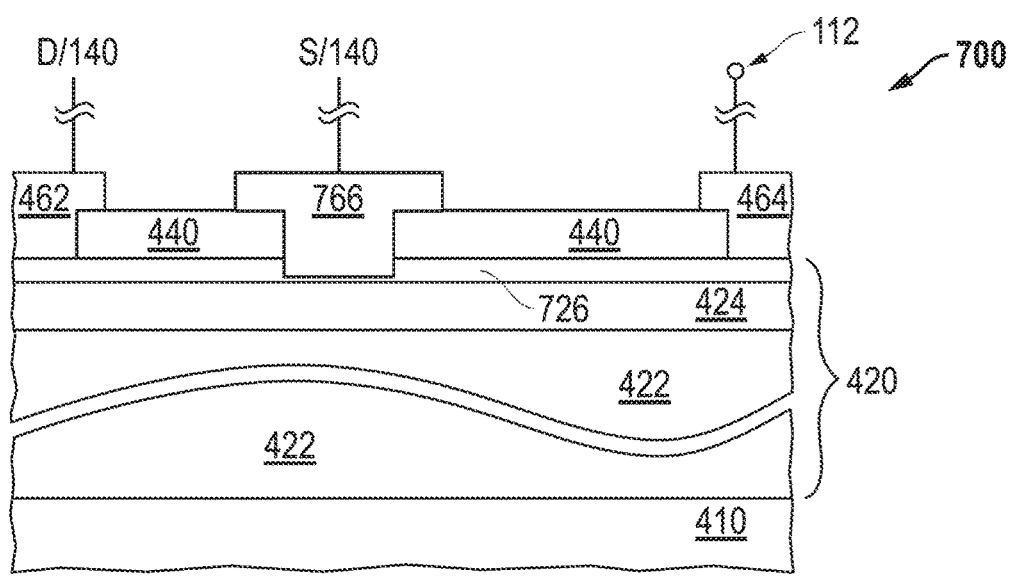
FIG. 7 includes a cross-sectional view of an alternative principal drive high-side transistor of the cascode circuit.

In another embodiment, the thickness of the barrier layer under the gate electrode of the bypass transistor structure may be thinner for the bypass transistor structure as compared to the principal drive transistor structure. FIG. 7 includes a cross-sectional view of an alternative embodiment that illustrates a portion of the workpiece that includes a principal drive high-side transistor structure 700. The principal drive high-side transistor structure 700 can be substantially the same as the principal drive high-side transistor structure 400 except that the barrier layer 726 is thinner than the barrier layer 426 of the principal high-side transistor structure 400. In an embodiment, the barrier layer 726 may be etched near the gate electrode 766 of the bypass transistor structure 700 to form a recess in the barrier layer 726 under the gate electrode 766. In an embodiment, the barrier layer 726 can have a thickness in a range of 10% to 90% of the thickness of the barrier layer 426. The thinner barrier layer 726 causes the pinch-off voltage to be higher (closer to 0 V), as compared the bypass transistor structure. Therefore, the barrier layer 726 can help allow the principal drive transistor structure 700 to have less degradation and a longer lifetime.

In another embodiment (not illustrated), two different barrier layers may be deposited, such that a thickness of a barrier layer under the gate electrode of the bypass transistor structure is less than a thickness of a different barrier layer under the gate electrode of the principal drive high-side transistor.

Figure 8:
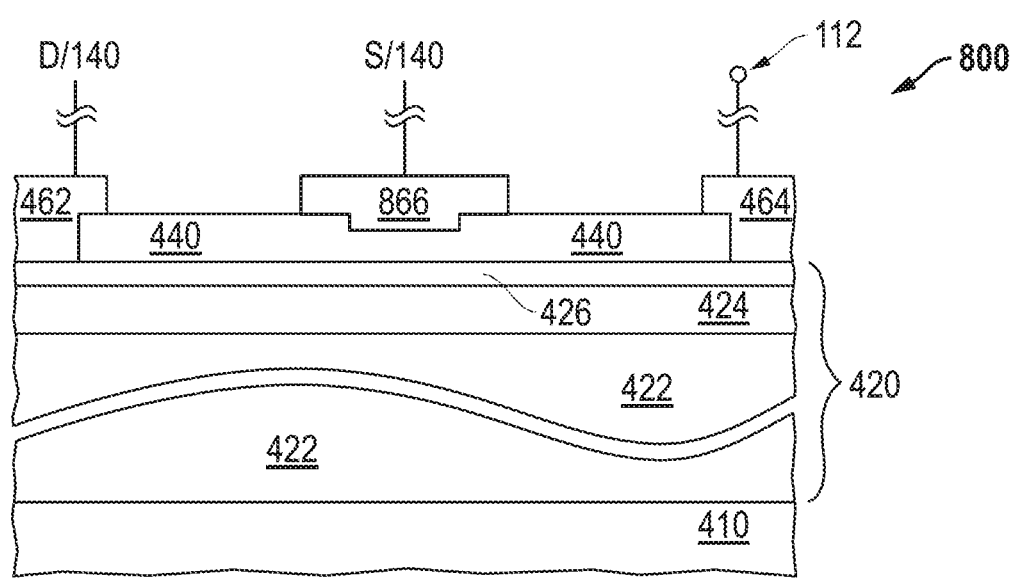
FIG. 8 includes a cross-sectional view of a further alternative bypass transistor of the cascode circuit where the cascode circuit includes the principal drive high-side transistor of FIG. 4.

In a further embodiment, the gate-to-drain distance can be different between the bypass transistor structure and the principal drive transistor structure. FIG. 8 includes a cross-sectional view of an alternative embodiment that illustrates a portion of the workpiece that includes a bypass transistor structure 800. The bypass transistor structure 800 can be substantially the same as the principal drive high-side transistor structure 400 except that the gate-to-drain distance between a gate electrode 866 and the drain electrode 464 of the bypass transistor structure is less than the gate-to-drain distance between the gate electrode 466 and the drain electrode 464 of the principal drive high-side transistor structures 400. Similar to the decreased gate length and thinner barrier layer, the bypass transistor structure 800 can have a higher leakage current as compared to the principal drive high-side transistor structure 400. Therefore, the bypass transistor structure 800 can help allow the principal drive transistor structure 400 to have less degradation and a longer operational lifetime.

In a still another embodiment (not illustrated), the principal drive high-side transistor structure and the bypass transistor structure can be configured to have different on-state electron densities within the channel layers. The on-state electron density can be affected by the aluminum content in the barrier layer (thickness held constant), an electron donor concentration in the channel layer (thickness held constant), or both. An increase in the aluminum content in the barrier layer, the electron donor concentration in the channel layer, or both decreases the on-state electron density within the channel layer and the pinch-off voltage (the pinch-off voltage for the transistor structure will be further from 0 V, when a negative voltage is applied to pinch off the transistor). In an embodiment, the aluminum content in the barrier layer for the bypass transistor structure can be higher than the aluminum content in the barrier layer of the principal drive high-side transistor structure. In another embodiment, the electron donor concentration in the channel layer for the bypass transistor structure can be higher than the electron donor concentration in the channel layer of the principal drive high-side transistor structure.

Further processing can be performed to make a substantially completed electronic device. One or more interlevel dielectric (ILD) layers and one or more interconnect levels can formed. Interconnects can be used and form field electrodes to improve performance of the electronic device. In a finished electronic device, the source electrodes 462 are electrically connected to the drain of the low-side transistor (designated at D/140 in FIGS. 4, 6, 7, and 8), the gate electrodes 466, 666, 766, and 866 are electrically connected to the source of the low-side transistor 140 (designated at S/140 in FIGS. 4, 6, 7, and 8) and the drain electrodes 464 electrically connected to the high power supply terminal 112.

The cascode circuit is turned on when a positive voltage, such as +5 V to +15 V, is applied at the gate of the low-side transistor 140, and is turned off when the 0 volts or a negative voltage is applied at the gate of the low-side transistor 140. When in the off-state, the cascode circuit is configured such that more leakage current can flow through the bypass transistor than any particular principal drive high-side transistor structure. The lower leakage current flowing through such particular principal drive high-side transistor structure helps to reduce degradation of the principal drive high-side transistor structure, allows the dynamic $R_{DSON}$ to increase more slowly over the operational lifetime of the principal drive high-side transistor structure, and provide a longer operation lifetime of the principal drive high-side transistor. Some embodiments can be implemented with a relatively simple gate mask change (for example, the width or location of the gate electrode). Other embodiments may add a masking operation, a deposition, or both. After reading this specification, skilled artisans will be able to determine a way of achieving any one or more of the benefits described herein to best meet the needs or desires for a particular application, a fabrication process flow, or the like.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device can including a first transistor including a drain electrode, a gate electrode having a first gate length, and a source electrode; and a second transistor including a drain electrode, a gate electrode having a second gate length that is less than the first gate length, and a source electrode, wherein the drain electrodes of the first and second transistors are coupled to each other, the gate electrodes of the first and second transistors are coupled to each other, and the source electrodes of the first and second transistors are coupled to each other.

Embodiment 2

The electronic device of Embodiment 1, wherein the first transistor has a first gate electrode-to-drain electrode distance, and the second transistor has a second gate electrode-to-drain electrode distance that is less than the first gate electrode-to-drain electrode distance.

Embodiment 3

The electronic device of Embodiment 2, wherein the second transistor has a higher leakage current as compared to the first transistor when the gate electrodes of the first and second transistors are at a same voltage.

Embodiment 4

The electronic device of Embodiment 1, further including a third transistor, wherein a drain electrode of the third transistor is coupled to the source electrodes of the first and second transistors, and a source electrode of the third transistor is coupled to the gate electrodes of the first and second transistors.

Embodiment 5

The electronic device of Embodiment 4, wherein the first and second transistors are depletion-mode transistors, and the third transistor is an enhancement-mode transistor.

Embodiment 6

The electronic device of Embodiment 4, wherein the first and second transistors are on a same die, and the third transistor is on a different die.

Embodiment 7

The electronic device of Embodiment 4, further including a fourth transistor, a fifth transistor, and a sixth transistor, wherein:
  drain electrodes of the fourth and fifth transistors are coupled to the source electrode of the third transistor;
  gate electrodes of the fourth and fifth transistors are coupled to a source electrode of the sixth transistor; and
  source electrodes of the fourth and fifth transistors are coupled to a drain electrode of the sixth transistor.

Embodiment 8

The electronic device of Embodiment 1, wherein the first transistor has a first effective channel width, the second transistor has a second effective channel width, and the first effective channel width is at least 11 times greater than the second effective channel width.

Embodiment 9

The electronic device of Embodiment 1, further including:
  a channel layer; and
  a barrier layer overlying the channel layer and having a recession, wherein at a first location within the recession, the barrier layer has a first thickness, and at a second location outside the recession, the barrier layer has a second thickness that is greater that the first thickness,
  wherein:
    the gate electrode of the first transistor overlies the channel layer and the barrier layer at the first location; and
    the second gate electrode of the second transistor overlies the channel layer and the barrier layer at the second location.

Embodiment 10

The electronic device of Embodiment 1, wherein the first transistor includes a first channel layer, the second transistor includes a second channel layer, and the first and second channel layers are configured to have different on-state electron densities.

Embodiment 11

An electronic device can include:
  a channel layer;
  a barrier layer overlying the channel layer and having a recession, wherein at a first location, the barrier layer has a first thickness, and at a second location spaced apart from the first location, the barrier layer has a second thickness that is less than the first thickness;
  a gate electrode of a first transistor overlying the channel layer and the barrier layer at the first location; and
  a gate electrode of a second transistor overlying the channel layer and the barrier layer at the second location.

Embodiment 12

The electronic device of Embodiment 11, further including a gate dielectric layer, wherein the gate dielectric layer has substantially a same thickness and composition for the first and second transistors.

Embodiment 13

An electronic device can include:
  a first transistor including a drain electrode, a gate electrode, and a source electrode; and
  a second transistor including a drain electrode, a gate electrode, and a source electrode, wherein:
    the drain electrodes of the first and third transistors are coupled to each other, the gate electrodes of the first and third transistors are coupled to each other, and the source electrodes of the first and third transistors are coupled to each other; and
    the first transistor has a first effective channel width, the second transistor has a second effective channel width, and the first effective channel width is at least 11 times greater than the second effective channel width.

Embodiment 14

The electronic device of Embodiment 13, wherein the first effective channel width is at least 50 times greater than the second effective channel width.

Embodiment 15

The electronic device of Embodiment 13, wherein the first transistor includes more transistor structures as compared to the second transistor.

Embodiment 16

The electronic device of Embodiment 15, wherein the first transistor includes at least 50 more transistor structures than the second transistor.

Embodiment 17

The electronic device of Embodiment 16, wherein the second transistor includes a single transistor structure.

Embodiment 18

The electronic device of Embodiment 13, further including a third transistor, wherein a drain electrode of the third transistor is coupled to the source electrodes of the first and second transistors, and a source electrode of the third transistor is coupled to the gate electrodes of the first and second transistors.

Embodiment 19

The electronic device of Embodiment 18, wherein the first and second transistors are depletion-mode transistors, and the third transistor is an enhancement-mode transistor.

Embodiment 20

The electronic device of Embodiment 13, wherein the second transistor has a higher leakage current as compared to the first transistor, wherein the gate electrodes of the first and second transistors are at a same voltage.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
a first transistor including a drain electrode, a gate electrode having a first gate length, and a source electrode;
a second transistor including a drain electrode, a gate electrode having a second gate length that is less than the first gate length, and a source electrode, wherein the drain electrodes of the first and second transistors are coupled to each other, the gate electrodes of the first and second transistors are coupled to each other, and the source electrodes of the first and second transistors are coupled to each other; and
a third transistor including a drain electrode and a source electrode, wherein the drain electrode of the third transistor is coupled to the source electrodes of the first and second transistors, and the source electrode of the third transistor is coupled to the gate electrodes of the first and second transistors.

2. The electronic device of claim 1, wherein the first transistor has a first gate electrode-to-drain electrode distance, and the second transistor has a second gate electrode-to-drain electrode distance that is less than the first gate electrode-to-drain electrode distance.

3. The electronic device of claim 2, wherein the second transistor has a higher leakage current as compared to the first transistor when the gate electrodes of the first and second transistors are at a same voltage.

4. The electronic device of claim 1, wherein the first and second transistors are depletion-mode transistors, and the third transistor is an enhancement-mode transistor.

5. The electronic device of claim 1, wherein the first and second transistors are on a same die, and the third transistor is on a different die.

6. The electronic device of claim 1, further comprising a fourth transistor, a fifth transistor, and a sixth transistor, wherein:
drain electrodes of the fourth and fifth transistors are coupled to the source electrode of the third transistor;
gate electrodes of the fourth and fifth transistors are coupled to a source electrode of the sixth transistor; and
source electrodes of the fourth and fifth transistors are coupled to a drain electrode of the sixth transistor.

7. The electronic device of claim 1, wherein the first transistor has a first effective channel width, the second transistor has a second effective channel width, and the first effective channel width is at least 11 times greater than the second effective channel width.

8. The electronic device of claim 1, further comprising:
a channel layer; and
a barrier layer overlying the channel layer and having a recession, wherein at a first location within the recession, the barrier layer has a first thickness, and at a second location outside the recession, the barrier layer has a second thickness that is greater that the first thickness,
wherein:
the gate electrode of the first transistor overlies the channel layer and the barrier layer at the first location; and
the second gate electrode of the second transistor overlies the channel layer and the barrier layer at the second location.

9. The electronic device of claim 1, wherein the first transistor includes a first channel layer, the second transistor includes a second channel layer, and the first and second channel layers are configured to have different on-state electron densities.

10. An electronic device comprising:
a first transistor including a drain electrode, a gate electrode, and a source electrode; and
a second transistor including a drain electrode, a gate electrode, and a source electrode,
wherein:
the drain electrodes of the first and second transistors are coupled to each other, and the source electrodes of the first and second transistors are coupled to each other; and
the first transistor has a first effective channel width, the second transistor has a second effective channel width, and the first effective channel width is at least 11 times greater than the second effective channel width.

11. The electronic device of claim 10, wherein the first effective channel width is at least 50 times greater than the second effective channel width.

12. The electronic device of claim 10, wherein the first transistor includes more transistor structures as compared to the second transistor.

13. The electronic device of claim 12, wherein the first transistor includes at least 50 more transistor structures than the second transistor.

14. The electronic device of claim 13, wherein the second transistor includes a single transistor structure.

15. The electronic device of claim 10, further comprising a third transistor, wherein:
   a drain electrode of the third transistor is coupled to the source electrodes of the first and second transistors; and
   a source electrode of the third transistor is coupled to the gate electrodes of the first and second transistors.

16. The electronic device of claim 15, wherein the first and second transistors are depletion-mode transistors, and the third transistor is an enhancement-mode transistor.

17. The electronic device of claim 10, wherein the second transistor has a higher leakage current as compared to the first transistor, wherein the gate electrodes of the first and second transistors are electrically connected to each other.

\* \* \* \* \*